(12) United States Patent
Kräuter et al.

(10) Patent No.: US 9,006,773 B2
(45) Date of Patent: Apr. 14, 2015

(54) HOUSING FOR AN OPTOELECTRONIC COMPONENT AND METHOD FOR PRODUCING A HOUSING

(75) Inventors: Gertrud Kräuter, Regensburg (DE); Bernd Barchmann, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 200 days.

(21) Appl. No.: 13/511,414

(22) PCT Filed: Nov. 2, 2010

(86) PCT No.: PCT/EP2010/066650
§ 371 (c)(1),
(2), (4) Date: Jul. 12, 2012

(87) PCT Pub. No.: WO2011/064072
PCT Pub. Date: Jun. 3, 2011

(65) Prior Publication Data
US 2012/0273811 A1 Nov. 1, 2012

(30) Foreign Application Priority Data
Nov. 25, 2009 (DE) .......................... 10 2009 055 786

(51) Int. Cl.
*H01L 33/00* (2010.01)
*H01L 31/0203* (2014.01)
(Continued)

(52) U.S. Cl.
CPC ............ *H01L 31/0203* (2013.01); *H01L 33/44* (2013.01); *H01L 33/486* (2013.01);
(Continued)

(58) Field of Classification Search
CPC ..... H01L 33/502; H01L 33/504; H01L 33/60; H01L 2224/8592; H01L 33/50; H01L 33/56; H01L 25/167; H01L 23/49575; H01L 2924/12041; H01L 33/46; H01L 23/145

USPC ...................... 257/98, 99, E33.066, E33.072, 257/E31.127, E33.06
See application file for complete search history.

(56) References Cited

U.S. PATENT DOCUMENTS

| 6,680,490 B2 | 1/2004 | Yasukawa et al. |
| 2006/0014429 A1 | 1/2006 | Schmid et al. |

(Continued)

FOREIGN PATENT DOCUMENTS

| CN | 101136447 | 3/2008 |
| CN | 101523621 | 9/2009 |

(Continued)

OTHER PUBLICATIONS

English translation of the Japanese Examination Report dispatched Apr. 1, 2014 from corresponding Japanese Patent Application No. 2012-540348.

(Continued)

*Primary Examiner* — Thien F Tran
(74) *Attorney, Agent, or Firm* — DLA Piper LLP (US)

(57) ABSTRACT

A housing for an optoelectronic component including a main housing body formed by a first plastics material, and which has a recess, and a coating formed by a second plastics material, and which, at least in a region of the recess, connects at least in places to the main housing body and is in direct contact with the main housing body, wherein the first plastics material is different from the second plastics material, and the first plastics material and the second plastics material differ from one another with regard to at least one of the following material properties: temperature resistance with regard to discoloration, temperature resistance with regard to deformation, temperature resistance with regard to destruction, and resistance to electromagnetic radiation.

16 Claims, 2 Drawing Sheets

(51) Int. Cl.
  *H01L 33/44* (2010.01)
  *H01L 33/48* (2010.01)
  *H01L 33/60* (2010.01)
  *H01L 33/64* (2010.01)

(52) U.S. Cl.
  CPC .............. *H01L 33/60* (2013.01); *H01L 33/641* (2013.01); *H01L 2224/48247* (2013.01); *H01L 2924/3025* (2013.01)

(56) References Cited

U.S. PATENT DOCUMENTS

| | | | |
|---|---|---|---|
| 2006/0060867 A1 | 3/2006 | Suehiro | |
| 2007/0269927 A1 | 11/2007 | Hofer et al. | |
| 2008/0054287 A1 | 3/2008 | Oshio et al. | |
| 2008/0111148 A1 | 5/2008 | Zimmerman | |
| 2008/0210964 A1 | 9/2008 | Tomioka | |
| 2008/0224159 A1 | 9/2008 | Krauter et al. | |
| 2009/0026480 A1* | 1/2009 | Hayashi et al. | 257/98 |
| 2009/0026482 A1 | 1/2009 | Ruhnau et al. | |
| 2009/0101897 A1 | 4/2009 | Murphy et al. | |
| 2009/0218584 A1 | 9/2009 | Bogner | |

FOREIGN PATENT DOCUMENTS

| | | |
|---|---|---|
| DE | 602 09 964 | 11/2006 |
| DE | 102 29 067 | 8/2007 |
| DE | 10 2006 046 678 | 4/2008 |
| DE | 10 2008 038 748 | 2/2010 |
| JP | 7-195580 | 8/1995 |
| JP | 2000-37726 | 2/2000 |
| JP | 2004-71950 | 3/2004 |
| JP | 2006-108640 | 4/2006 |
| JP | 2007-42668 | 2/2007 |
| JP | 2007-262259 | 10/2007 |
| JP | 2007-281260 | 10/2007 |
| JP | 2008-60344 | 3/2008 |
| WO | 01/82385 | 11/2001 |
| WO | 03/038912 | 5/2003 |
| WO | 2008/040324 | 4/2008 |
| WO | 2008/060490 | 5/2008 |
| WO | 2008/125096 | 10/2008 |
| WO | 2009/075530 | 6/2009 |
| WO | 2010/017790 | 2/2010 |

OTHER PUBLICATIONS

English translation of the Chinese Examination Report dated Apr. 16, 2014 from corresponding Chinese Application No. 201080053529.X.

English translation of the Notice of Reasons for Rejection of corresponding JP 2012-540348 dated Dec. 12, 2014.

* cited by examiner

HOUSING FOR AN OPTOELECTRONIC COMPONENT AND METHOD FOR PRODUCING A HOUSING

RELATED APPLICATIONS

This is a §371 of International Application No. PCT/EP2010/066650, with an international filing date of Nov. 2, 2010 (WO 2011/064072, published Jun. 3, 2011), which claims the priority of German Patent Application No. 10 2009 055 786.5, filed Nov. 25, 2009, the entire contents of which are hereby incorporated by reference.

TECHNICAL FIELD

This disclosure relates to housings for optoelectronic components, optoelectronic devices and methods of producing such housings.

BACKGROUND

There is a need to provide a housing for an optoelectronic component that is distinguished by an increased aging resistance and at the same time improved optical properties.

SUMMARY

We provide a housing for an optoelectronic component including a main housing body formed by a first plastics material, and which has a recess, and a coating formed by a second plastics material, and which, at least in a region of the recess, connects at least in places to the main housing body and is in direct contact with the main housing body, wherein the first plastics material is different from the second plastics material, and the first plastics material and the second plastics material differ from one another with regard to at least one of the following material properties: temperature resistance with regard to discoloration, temperature resistance with regard to deformation, temperature resistance with regard to destruction, and resistance to electromagnetic radiation.

We also provide an optoelectronic device including a housing and at least one optoelectronic component which is a radiation-emitting semiconductor chip, arranged in the recess of the main housing body.

We further provide a housing for an optoelectronic component including a main housing body formed by a first plastics material and which has a recess, and a coating of substantially uniform thickness formed by a second plastics material and which, at least in a region of the recess, connects at least in places to the main housing body and is in direct contact with the main housing body, wherein the first plastics material is different from the second plastics material, and the first plastics material and the second plastics material differ from one another with regard to at least one of the following material properties: temperature resistance with regard to discoloration, temperature resistance with regard to deformation, temperature resistance with regard to destruction, and resistance to electromagnetic radiation.

We still further provide a housing for an optoelectronic component including a main housing body formed by a first plastics material which is a recycled plastics material and which has a recess, and a coating formed by a second plastics material and which, at least in a region of the recess connects at least in places to the main housing body and is in direct contact with the main housing body, wherein the first plastics material is different from the second plastics material, and the first plastics material and the second plastics material differing from one another with regard to at least one of the following material properties: temperature resistance with regard to discoloration, temperature resistance with regard to deformation, temperature resistance with regard to destruction, and resistance to electromagnetic radiation.

DETAILED DESCRIPTION

Figure 1:
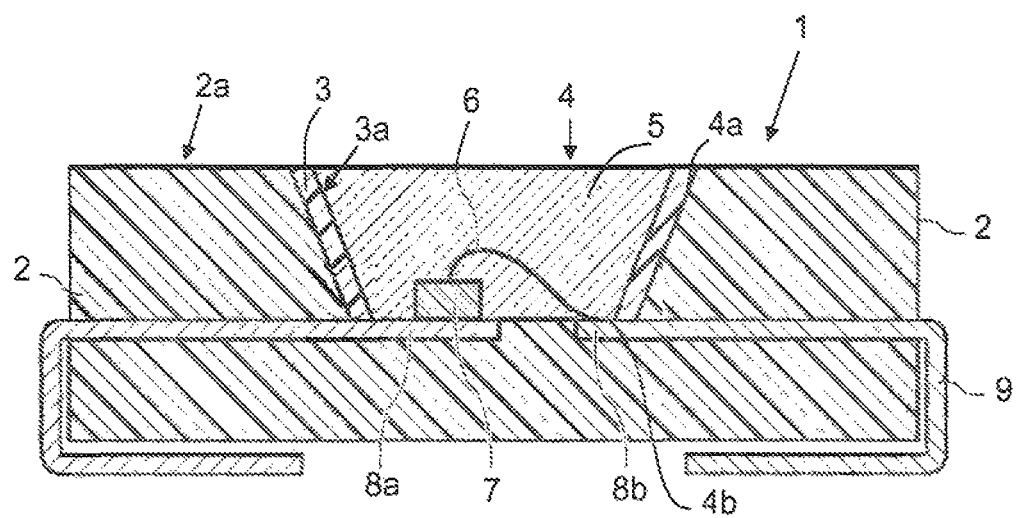
FIGS. 1 to 3 show side views of examples of optoelectronic devices with examples of housings which can be produced by our methods.

We provide a housing for an optoelectronic component. The optoelectronic component is, for example, an optoelectronic semiconductor chip. The optoelectronic semiconductor chip may be radiation-receiving or radiation-emitting. For example, the housing may be a housing for at least one light-emitting diode chip, at least one laser diode chip and/or at least one photodiode chip.

The housing may comprise a main housing body which has a recess. The recess of the main housing body is formed such that it is suitable for receiving at least one optoelectronic component. The recess may, for example, have side walls which laterally bound the recess and laterally surround an optoelectronic component arranged in the housing.

The housing may comprise a coating which, at least in the region of the recess, connects at least in places to the main housing body and is in direct contact with the main housing body. The coating is, therefore, a part of the housing that is, for example, applied directly to an outer area of the main housing body. The coating is in this case present at least in the region of the recess. For example, the main housing body may be completely covered by the coating in the region of the recess. Furthermore, it is possible that only side areas or parts of side areas of the recess of the main housing body are covered by the coating and other regions of the recess, for example, its bottom area, are free from the coating or substantially free from the coating. Substantially free from the coating may mean, for example, that the bottom area of the recess is covered with the coating at most over a proportion of the surface area of 20%, in particular at most 10%.

The coating has in particular a uniform thickness. This means in particular that, within the limits of production tolerance, the thickness of the coating does not change over the entire coating.

The coating is preferably connected to the main housing body with such mechanical strength that detachment of the coating from the main housing body would lead to destruction of the coating and/or of the main housing body. In other words, the main housing body and the coating form a unit that cannot be broken up without being destroyed.

The main housing body may be formed by a first plastics material and the coating is formed by a second plastics material, the first plastics material being different from the second plastics material. This means that the housing body and the coating are formed from different materials. The housing body and the coating are preferably formed from different plastics materials, it being possible for the plastics materials of the housing body and the coating to have identical components, but differ from one another in at least one component.

The first plastics material and the second plastics material may differ from one another with regard to at least one of the following material properties:
temperature resistance with regard to discoloration,
temperature resistance with regard to deformation,
temperature resistance with regard to destruction,
resistance to electromagnetic radiation.

Temperature resistance is understood here in particular as follows: the plastics material with the greater temperature resistance is distinguished in particular by being discolored, deformed or destroyed only from a higher limiting temperature than the plastics material with the lower temperature resistance. Alternatively or in addition, the plastics material with the greater temperature resistance can withstand deformation, discoloration or destruction at a given temperature for a longer time than the material with the lower temperature resistance. It may be, for example, that one plastics material is a material which withstands discoloration for longer than the other plastics material, but is less resistant with regard to deformation than the other plastics material.

Resistance to electromagnetic radiation is understood in particular as follows: the material with the greater resistance to electromagnetic radiation deforms or discolors later than the plastics material with the lower resistance to electromagnetic radiation if the two plastics materials are subjected to the same exposure to electromagnetic radiation. Electromagnetic radiation is, for example, electromagnetic radiation from the wavelength range of UV radiation or blue light. In particular, discoloration of the plastics material with greater resistance to electromagnetic radiation then occurs with a delay in comparison with a material with lower resistance to electromagnetic radiation.

The housing may comprise a main housing body which has a recess and comprises a coating, which, at least in the region of the recess, connects at least in places to the main housing body and is in direct contact with the main housing body, the main housing body being formed by a first plastics material, the coating being formed by a second plastics material, the first plastics material being different from the second plastics material, and the first plastics material and the second plastics material differing from one another with regard to at least one of the following material properties:
temperature resistance with regard to discoloration,
temperature resistance with regard to deformation,
temperature resistance with regard to destruction,
resistance to electromagnetic radiation.

In the case of a housing described here, it is at the same time possible in particular that the plastics material with the greater temperature resistance has the lower resistance to electromagnetic radiation. It is also theoretically possible for the same plastics materials to be used and the different properties of the main housing body and the coating to be adjusted by fillers in the plastics material. Furthermore, it is possible in particular to use for the main body recycled plastics, which may be less stable and of a color that actually makes them unusable for use in a housing. The housing described here can, therefore, be produced at particularly low cost and with particularly low impact on the environment.

The main body and the coating of the housing differ from one another with regard to their optical properties. At the same time, it is not necessary that the plastics materials of the main housing body and the coating differ from one another with regard to their optical properties. In this case, the optical properties of the main housing body and/or the coating may be specifically adjusted by fillers in the first and/or in the second plastics material. For example, the coating may be adjusted to reflect electromagnetic radiation from a specific wavelength range, whereas the main housing body may be configured to absorb radiation for the same or another wavelength range. However, it is also possible that the plastics materials, that is to say the first and second plastics materials, have different optical properties from one another. In this case, it may then be possible that neither the first plastics material nor the second plastics material for forming the main housing body and the coating is provided with a filler. The main housing body may then consist of the first plastics material and the coating may consist of the second plastics material.

The coating may have a reflectivity of greater than 80% for a UV radiation. This means that the reflectivity of the coating may be greater than 80% for at least one wavelength from the range of UV radiation. The reflectivity of the coating may with preference be greater than 90%, with particular preference greater than 95%.

The coating may have a reflectivity of greater than 80% for a visible radiation. This means that the reflectivity of the coating may be greater than 80% for at least one wavelength from the visible range. The coating may in this case have a reflectivity of greater than 90%, with preference greater than 95% for this wavelength. It is also possible that the coating has the reflectivities mentioned for a UV radiation and a visible radiation.

The coating may comprise the second plastics material and a white pigment. The white pigment may, for example, be introduced into the second plastics material in the form of particles and/or in the form of fibers. The coating may then consist in particular of the second plastics material and the white pigment. The white pigment is for example, an achromatic inorganic pigment with a high refractive index of preferably greater than 1.45, with preference greater than 1.75. The white pigment may in this case comprise at least one of the following materials: titanium dioxide in the anatase configuration and/or in the rutile configuration, lithopone, barium sulfate, zinc oxide, zinc sulfide, zirconia, boron nitride, alumina (for example Al2O3), aluminum nitride. On account of the white pigment, it is possible in particular that the coating appears white to the observer.

The second plastics material may have a lower temperature resistance, for example, with regard to discoloration, that is to say for instance yellowing, than the first plastics material. The second plastics material optionally forms the coating of the housing with further fillers. It is possible in this case that the second plastics material may be kept at a distance from locations at which increased temperatures occur in the housing. For example, it is possible that the coating is heated less strongly than the main housing body during assembly of the housing by soldering. A plastics material that is less temperature resistant with regard to discoloration may then be chosen for the second plastics material. At the same time, the second plastics material may, however, be more temperature resistant than the first plastics material with regard to deformation. When the second plastics material is applied, the first then becomes softer, that is to say, for example, slightly melted, whereby the adhesive bond between the two plastics materials improves. The first plastics material then has a lower melting point than the second plastics material.

The first plastics material may have a lower resistance to electromagnetic radiation than the second plastics material. The main housing body may be formed by the first plastics material. The main housing body may be shielded at least in places by the coating from electromagnetic radiation generated, for example, in the component of the housing or outside the housing. It may, therefore, be sufficient to choose a radiation-resistant material for the second plastics material and to use a less radiation-resistant material for the first plastics material.

The first plastics material may be selected from a group comprising at least one of the following materials: polyamide, polyphenylene sulfide, polyether imide, polyphenyl sulfone, polyphthalamide, polyether ether ketone. These materials prove to be particularly temperature-resistant on their own or when mixed with other materials so that they can, for example, withstand the stresses in a soldering operation.

The second plastics material may be selected from a group comprising at least one of the following materials: polyester, fluoropolymer, polyether ketone, liquid crystal polymer, silicone, polyamide, polyphthalamide. These materials prove to be particularly resistant to electromagnetic radiation, for example, from the UV range and/or the range of visible radiation so that they are particularly well suited for forming the coating on their own or when mixed with other materials.

The housing may have a further coating connected at least in places to the main housing body and is in direct contact with the main housing body, the further coating being applied to an outer area of the main housing body, and the further coating differing from the main housing body and the coating with regard to its optical properties. The further coating may in this case be formed by the first plastics material, by the second plastics material or a further plastics material. For example, the further coating is formed by the same plastics material as the coating, but differs from the coating in its optical properties. The further coating may then for example, contain radiation-absorbing material such as, for example, carbon black particles, whereby the further coating is formed to be radiation-absorbing. For example, an outer area of the main housing body that surrounds the recess may be provided with the further coating. If the further coating is formed to be radiation-absorbing, for example, black so the contrast between the coating and the further coating is particularly great in a plan view of the housing.

Furthermore, it is possible that the further coating consists of the same plastics material as the housing, but differs from it with regard to the optical properties. Thus, the further coating may, for example, be formed to be radiation-absorbing. This may in turn be achieved by adding a filler such as, for example, carbon black to the first plastics material.

The main housing body, the coating and, if present, the further coating may be respectively injection molded. Injection molding can be distinguished from other production processes by the traces left behind that are typical of the production process such as a seam or the sprue of an injection nozzle on the finished housing. Therefore, the feature of injection molding is a feature related to the housing that can be distinguished from other methods of production. In other words, the housing is produced by a multi-component injection-molding process, for example, a two-component injection-molding process or a three-component injection-molding process. The main housing body, the coating and, if present, the further coating may be connected to one another mechanically without any connecting means. In other words, the components of the housing such as the main housing body and the coating form a strong connection that cannot be released without destruction, which is not brought about by a connecting means such as, for example, an adhesive between the components. Such a connection without connecting means between the components of the housing is possible in particular by producing the housing in a multi-component injection-molding process.

We also provide a method for producing a housing as described above and in examples presented here. This means that all of the features disclosed for the housing are also disclosed for the method for producing the housing. According to the method for producing the housing, the main housing body, the coating and, if present, the further coating connect to one another by a multi-component injection-molding process.

As an alternative to a multi-component injection-molding process, it is also possible that only the first plastics material is injection molded. The second plastics material may then take the form of a film, for example, with reflective fillers. This is possible in particular whenever the second plastics material comprises a material or consists of a material that can only be injection molded with difficulty or not at all such as, for instance, some types of PTFE. The film may then either be placed in an empty mold and laminated with the first plastics material, or the film is pressed onto the already finished main housing body under temperatures close to the melting point in order to produce an adhesive bond. The film may then be 0.1 to 0.5 mm thick and has with preference a reflectivity of greater than 90% for UV radiation and/or visible light.

We further provide an optoelectronic device. The optoelectronic device comprises a housing as provided in at least one of the examples described here or in at least one of the examples described here. This means that all of the features described for the housing are also disclosed for the optoelectronic device. The optoelectronic device also comprises at least one radiation-emitting semiconductor chip such as, for example, a light-emitting diode chip or a laser diode chip. The at least one radiation-emitting semiconductor chip is arranged in the recess of the main housing body. The at least one radiation-emitting semiconductor chip may, for example, be fastened to the bottom area of the recess and be electrically connected. For this purpose, the housing may have apart from the main housing body and the coatings, for example, electrically conducting connection points connected to at least one further component of the housing in a mechanically strong manner, for example, by the multi-component injection-molding process.

The housing described here, the optoelectronic device described here and the method for producing a housing described here are described in more detail below on the basis of examples and the associated figures.

Elements that are identical, are of an identical type or act identically are provided with the same reference signs in the figures. The figures and the relative sizes of the elements shown in the figures with respect to one another should not be regarded as to scale. Rather, individual elements may be shown with an exaggerated size for better illustration and/or better understanding.

FIG. 1 shows a schematic sectional representation of a first example of an optoelectronic device. The optoelectronic device comprises a housing 1. The housing 1 has a main housing body 2. The main housing body 2 is formed by a first plastics material. The main housing body 2 may in this case contain at least one of the following plastics materials or consist of one of the following plastics materials: high-temperature polyamides, polyphenylene sulfide (PPS), polyether imide (PEI) and/or polyphenyl sulfone (PPSU), polyether ketone or LCP. Recycled grades of material may also be used.

With preference, a low-cost, solder-resistant thermoplastic material is used for the main housing body 2. The first plastics material for the main housing body 2 is therefore distinguished, for example, by a particularly great temperature resistance.

The main housing body 2 also has a recess 4 in which in places there is no material of the main housing body. The recess 4 is, for example, bounded by a beveled side wall 4a and a bottom area 4b. The recess 4 is dimensioned such that it is suitable to receive at least one optoelectronic semiconductor chip.

The main housing body 2 has on its upper side, facing away from the bottom area 4b of the recess 4, an outer area 2a, which surrounds the recess 4.

The housing 1 also comprises a coating 3. The coating 3 is formed by a second plastics material different from the first plastics material of the housing body 2. For example, one of the following second plastics materials is suitable for the coating 3: high-temperature polyamides such as Amodel, Grivory, Genestar, Zytel HTN, Stanyl, PA4T, which may contain further mineral fillers such as glass fibers or other fillers to improve the aging stability, and/or polyesters such as PBT (Pocan), PET (Impet), PEN, PCT, optionally with mineral fillers such as glass fibers or other fillers, and/or moldable fluoropolymers such as PFA, Moldflon, FEP, optionally with mineral fillers such as glass fibers or other fillers, and/or PEEK, LCP, optionally with mineral fillers such as glass fibers or other fillers, and/or liquid-silicone injection molded silicone.

The outer area 3a of the coating 3 serves, for example, to reflect electromagnetic radiation and for this purpose is filled with a white pigment. The coating 3 consists, for example, of the second plastics material and the white pigment which may take the form of particles. For example, a titanium dioxide is used as the white pigment.

The white pigment is present, for example, in a concentration of 10% to 35%.

In the example of FIG. 1, the coating 3 in the region of the recess 4 is applied to the outer area of the housing body 2. The housing body 2 and the coating 3 are in this case connected to one another by a two-component injection-molding process.

The housing 1 also has connection points 9, which in the region of the recess 4 form connection regions 8a, 8b for the electrical contacting of an optoelectronic component. The main housing body 2 and optionally the coating 3 may be connected to parts of the connection points 9 by the multi-component injection-molding process.

The optoelectronic device also has an optoelectronic component, for example, an optoelectronic semiconductor chip 7, which is preferably a radiation-emitting optoelectronic semiconductor chip such as a light-emitting diode chip or a laser diode chip.

The optoelectronic semiconductor chip 7 connects in an electrically conducting manner to the first connection region 8a and the second connection region 8b of the connection points 9. For example, the optoelectronic semiconductor chip 7 may be connected in an electrically conducting manner to the second connection region 8a with a contact wire 6. In this case, the recess 4 is filled with a casting material 5 which is formed to be radiation-transparent. Radiation-diffusing and/or luminescence-converting particles may be introduced into the casting material 5. The casting material 5 is, for example, in direct contact with the outer area 3a of the coating 3.

The following combinations are particularly well suited for choosing the first plastics material and the second plastics material:
the first plastics material has a slightly_lower melting point than the second plastics material if the first plastics material is injection molded first. For example, the melting point of the first plastics material lies between 10° and 30° below the melting point of the second plastics material. One of the following materials may be used, for example, for the first plastics material: PA4T, PA8T, PA10T/PA66, PBT, PET. One of the following materials may be used, for example, for the second plastics material: PA6T/61, PA6T/66, PEEK, LCP.

For example, the second plastics material of the coating 3 may be a silicone which is filled with a white pigment such as, for example, particles of a titanium dioxide. In this case, it proves to be particularly advantageous if the casting material 5 likewise contains a silicone or consists of a silicone. In this case, the adhesive bond between the housing 1 and the casting material 5 is particularly great so that the probability of delamination of the casting material 5 during the operation of the semiconductor chip 7 is reduced.

Figure 2:
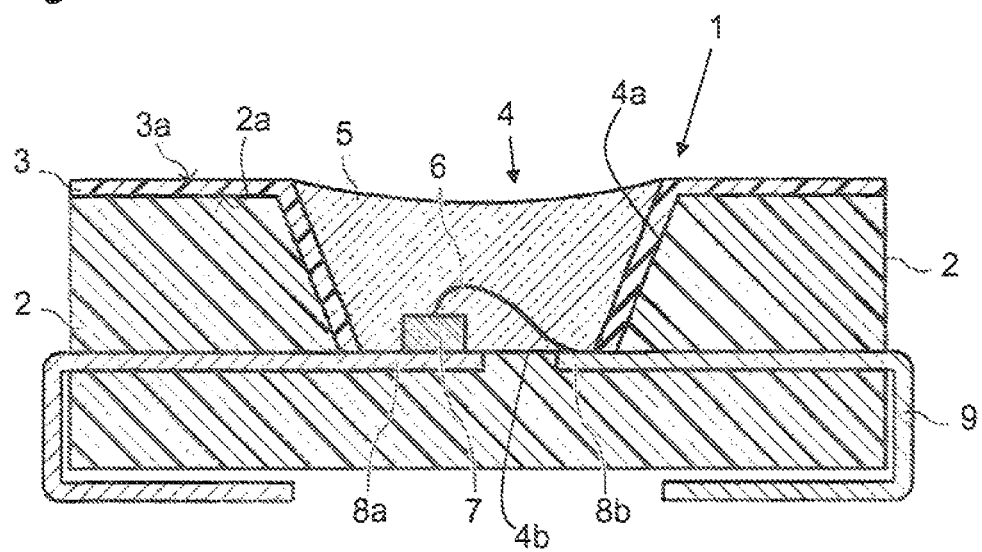

A further example of an optoelectronic device described here is explained in more detail in conjunction with FIG. 2 on the basis of a schematic sectional representation. As a difference from the example of FIG. 1, not only does the coating 3 cover the main housing body 2 in the region of the recess 4, but the outer area 2a of the main body 2 is also covered at least in places by the coating 3. For example, the coating 3 completely covers the main housing body 2 on its upper side, facing away from the bottom area 4b of the recess 4. The coating 3 may in this case be formed to be radiation-reflecting and/or radiation-absorbing. For example, it may prove advantageous if the coating 3 is formed in a black color so that the contrast between the light emitted by the optoelectronic semiconductor chip 7 and the surrounding housing 1 is particularly great. The main housing body 2 may in this case be formed in a different color, for example, white.

In the example of FIG. 2, the coating 3 and the housing body 2 are also once again connected to one another by a two-component injection-molding process, the housing body 2 and the coating 3 being produced by injection molding. No connector is arranged between the main housing body 2 and the coating 3 so that the connection between the two housing components is free from a connector.

Figure 3:
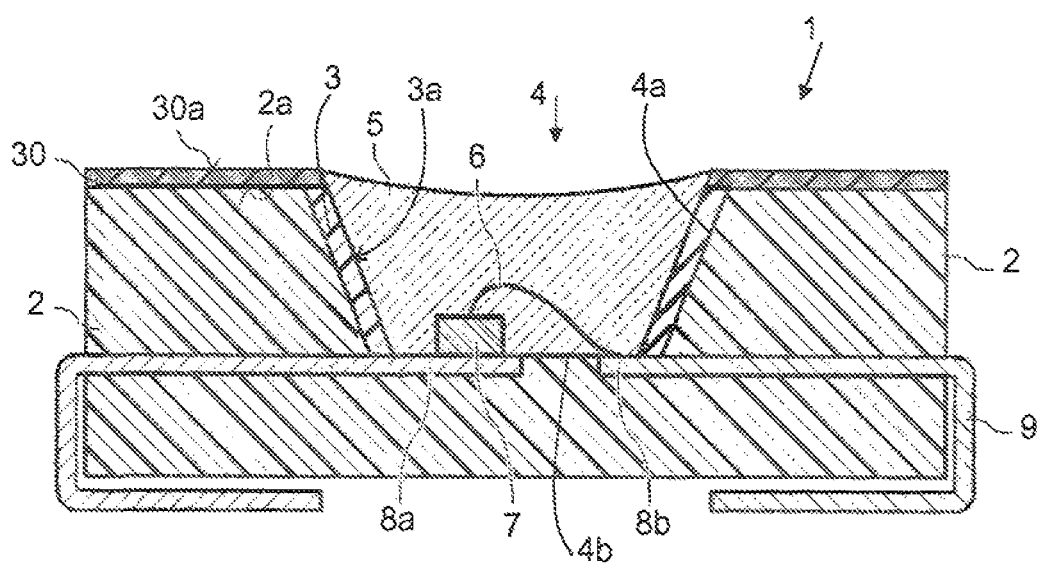

A further example is explained in more detail in conjunction with FIG. 3 on the basis of a schematic sectional representation. As a difference from the example of FIGS. 1 and 2, the example of FIG. 3 has a further coating 30 which differs in its optical properties from the optical properties of the main housing body 2 and the coating 3. For example, the further coating 30 is formed to be radiation-absorbing, whereas the coating 3 is formed to be reflecting. The housing body 2 may then be formed to be less absorbing than the further coating 30 and less reflecting than the coating 3. The coating 30 may in this case be fastened to the main housing body 2 and the coating 3 by a further injection-molding process. For example, in the example of FIG. 3, the housing 1 is produced by a three-component injection-molding process.

The further coating 30 may in this case be formed from the first plastics material of the main housing body 2, from the second plastics material of the coating 3 or from a further plastics material.

Altogether, a housing described here and an optoelectronic device described here prove to be particularly advantageous, since different materials are used for different components of the housing 1, the properties of which materials are adapted to the operating requirements for these components. Thus, a highly reflective material mixture that is stable in terms of aging because it is resistant to radiation may be used in the region of the recess for the coating 3, whereas the main body 2 of the housing 1 is produced from an inexpensive, for example, recycled plastic which is distinguished, for example, by a great soldering resistance, that is to say in particular by a great temperature resistance.

Our housings and methods are not restricted by the description on the basis of the examples. Rather, this disclosure comprises any novel feature and any combination of features, including in particular any combination of features in the appended claims, even if the feature or combination itself is not explicitly specified in the claims or examples.

The invention claimed is:
1. A housing for an optoelectronic component comprising:
a main housing body formed by a first plastics material, and which has a recess,
a coating formed by a second plastics material, and which, at least in a region of the recess, connects at least in places to the main housing body and is in direct contact with the main housing body, and a further coating, connected at least in places to the main housing body and directly contacts the main housing body, wherein the coating comprises the second plastics material and a white pigment, the further coating is formed from a radiation-absorbing material, the further coating is applied to an outer area of the main housing body, the further coating differs from the main housing body and the coating with regard to its optical properties, and the first plastics material is different from the second plastics material, and the first plastics material and the second plastics material differ from one another with regard to at least one of the following material properties:

temperature resistance with regard to discoloration,
temperature resistance with regard to deformation,
temperature resistance with regard to destruction, and
resistance to electromagnetic radiation.

2. The housing according to claim 1, wherein the first plastics material is a recycled plastics material.

3. The housing according to claim 1, wherein the main housing body and the coating differ from one another with regard to their optical properties.

4. The housing according to claim 1, wherein the coating has a reflectivity of greater than 80% for a UV radiation and/or for a visible radiation.

5. The housing according to claim 1, wherein the white pigment comprises at least one material selected from the group consisting of titanium dioxide, lithopone, barium sulfate, zinc oxide, zinc sulfide, alumina, boron nitride and zirconia.

6. The housing according to claim 1, wherein the second plastics material has a lower temperature resistance with regard to discoloration and a greater temperature resistance with regard to deformation than the first plastics material.

7. The housing according to claim 1, wherein the first plastics material has a lower resistance to electromagnetic radiation than the second plastics material.

8. The housing according to claim 1, wherein the first plastics material comprises at least one material selected from the group consisting of HT polyamide, polyphenylene sulfide, polyether imide, polyphenyl sulfone, polyphthalamide, polyether ether ketone, LCP and PEEK.

9. The housing according to claim 1, wherein the second plastics material comprises at least one material selected from the group consisting of polyester, fluoropolymer, polyether ketone, liquid crystal polymer, silicone, HT polyamide and polyphthalamide.

10. The housing according to claim 1, wherein the main housing body, the coating and the further coating are respectively injection molded.

11. The housing according to claim 1, wherein the main housing body, the coating and the further coating connect to one another mechanically without connector.

12. An optoelectronic device comprising a housing according to claim 1 and at least one optoelectronic component which is a radiation-emitting semiconductor chip, arranged in the recess of the main housing body.

13. A method for producing a housing according to claim 1, comprising connecting the main housing body, the coating and a further coating to one another by multi-component injection molding.

14. The housing according to claim 1, in which the coating has a substantially uniform thickness.

15. A housing for an optoelectronic component comprising:

a main housing body formed by a first plastics material and which has a recess that has side walls which laterally bound the recess and a bottom area, and a coating of substantially uniform thickness formed by a second plastics material and which covers the entire side walls of the recess and directly contacts the side walls and the bottom area, at least in a region of the recess, connects at least in places to the main housing body and a further coating applied to an outer area of the main housing body and in direct contact with the main housing body, wherein the coating comprises the second plastics material and a white pigment, the further coating is formed in a black color, the further coating differs from the main housing body and the coating with regard to its optical properties, the further coating covers an upper face of the coating that faces away from the bottom area of the recess at least in places and is in direct contact with the coating, and the first plastics material is different from the second plastics material, and the first plastics material and the second plastics material differ from one another with regard to at least one of the following material properties:

temperature resistance with regard to discoloration,
temperature resistance with regard to deformation,
temperature resistance with regard to destruction, and
resistance to electromagnetic radiation.

16. The housing according to claim 15, wherein the first plastics material is a recycled plastics material.

* * * * *